(12) United States Patent
Kaneda et al.

(10) Patent No.: US 7,469,016 B2
(45) Date of Patent: Dec. 23, 2008

(54) CIRCUIT FOR GENERATING TERNARY SIGNAL

(75) Inventors: Jinsaku Kaneda, Suita (JP); Akihiro Maejima, Takatsuki (JP); Hiroki Matsunaga, Takatsuki (JP); Eisaku Maeda, Takatsuki (JP); Hiroshi Ando, Ibaraki (JP)

(73) Assignee: Panasonic Corporation, Osaka (JP)

( * ) Notice: Subject to any disclaimer, the term of this patent is extended or adjusted under 35 U.S.C. 154(b) by 583 days.

(21) Appl. No.: 11/290,062

(22) Filed: Nov. 30, 2005

(65) Prior Publication Data

US 2006/0119389 A1    Jun. 8, 2006

(30) Foreign Application Priority Data

Dec. 3, 2004    (JP)    ............................. 2004-352040

(51) Int. Cl.
H04L 25/34    (2006.01)
(52) U.S. Cl. ................... 375/286; 326/59; 327/185
(58) Field of Classification Search ............. 326/56, 326/59–60; 375/257, 286, 377; 327/185, 327/333
See application file for complete search history.

(56) References Cited

U.S. PATENT DOCUMENTS 4,972,106 A * 11/1990 Ruijs .......................... 326/60
5,444,740 A * 8/1995 Mizukami et al. ........... 375/286
5,537,059 A * 7/1996 Asahina ....................... 326/81
5,543,744 A * 8/1996 Okumura ................... 327/333
5,548,229 A * 8/1996 Segawa et al. ............... 326/57
5,747,979 A    5/1998 Nagai
5,811,984 A * 9/1998 Long et al. ................... 326/30
6,040,709 A * 3/2000 Kishimoto .................. 326/59
6,815,984 B1* 11/2004 Bowers et al. ............... 327/112

FOREIGN PATENT DOCUMENTS

| JP | 03-185923 | 8/1991 |
| JP | 7-114361 | 5/1995 |
| JP | 09-138669 | 5/1997 |
| JP | 11-186849 | 7/1999 |
| JP | 2000-295086 | 10/2000 |

* cited by examiner

Primary Examiner—Khanh C Tran
(74) Attorney, Agent, or Firm—RatnerPrestia

(57) ABSTRACT

A circuit for generating a ternary signal that receives a binary input-control signal and a binary reset signal and outputs a ternary signal. The circuit includes first to third transistors, each source terminal thereof is respectively connected to the three power supplies, and a sequential circuit that outputs control signals controlling the transistors. The sequential circuit outputs control signals that make the first and the third transistors be switched in a complementary manner in an initial state, and make the second and the third transistors be switched in a state that it is released from the initial state.

9 Claims, 8 Drawing Sheets

CIRCUIT FOR GENERATING TERNARY SIGNAL

BACKGROUND OF THE INVENTION

1. Field of the Invention

The present invention relates to a circuit for generating a ternary signal which receives a binary input-control signal and a binary reset signal and outputs a ternary signal from an output terminal, and in particular, relates to a circuit for generating a ternary signal which includes at least three transistors respectively controlled by different control signals.

2. Description of the Related Art

In recent years, a circuit for generating a ternary signal that outputs an output signal having three levels is for use in a multi-channel driver being in use for a flat-panel display. As a circuit for generating a ternary signal of a prior art, disclosed in FIGS. 2 and 3 of the Japanese patent laid-open publication No. 7-114361 is a circuit for generating a ternary signal having two level-shifting circuits and complementary metal-oxide semiconductor transistors of a PMOS and an NMOS.

FIG. 7 is a circuit diagram showing a configuration of the circuit for generating a ternary signal of the prior art. The circuit for generating a ternary signal of the prior art has a level-shifting circuit 95, a level-shifting circuit 96, a control circuit 87, a high-potential-side P-channel transistor 4 (hereinafter, referred to as an HTR4), a low-potential-side N-channel transistor 5 (hereinafter, referred to as an LTR5), and a low-potential-side N-channel transistor 6 (hereinafter, referred to as an LTR6).

The circuit for generating a ternary signal of the prior art receives input signals 71, 72 and 73, which are high or low binary signals, from three input terminals A, B and C, respectively. High level is of a potential level of a predetermined power supply VCC (hereinafter, referred to as VCC level); low level is of a potential level of ground (hereinafter, referred to as ground level). The respective input signals 71, 72 and 73 from the input terminals A, B and C are inputted to the control circuit 87.

The control circuit 87 has NOR circuits 82, 83 and 84, and inverters 81, 85 and 86. The NOR circuit 82 receives the input signals 71, 72 and 73. The NOR circuit 83 receives the input signals 71 and 72. The inverter 81 receives the input signal 73. The NOR circuit 84 receives the input signals 71, 72 and an output signal of the inverter 81. The inverter 85 receives an output signal of the NOR circuit 82. The inverter 86 receives an output signal of the NOR circuit 83. The control circuit 87 outputs output signals 74, 75 and 76 from output terminals of the inverters 85 and 86 and the NOR circuit 84, respectively.

The level-shifting circuit 96 receives the output signal 75. The level-shifting circuit 96 outputs a high output signal 77 of VCC level when the output signal 75 is in high level (VCC level), and outputs a low output signal 77 of a negative potential of the power supply VCC (hereinafter, referred to as −VCC level) when the output signal 75 is in low level (ground level). The output signal 75 and the output signal 77 differ from each other in voltage level.

The level-shifting circuit 95 receives the output signal 76. The level-shifting circuit 95 outputs a high output signal 78 of VCC level when the output signal 76 is in high level (VCC level), and outputs a low output signal 78 of −VCC level when the output signal 76 is in low level (ground level). The output signal 76 and the output signal 78 differ from each other in voltage level.

The output signal 74 is inputted to a gate terminal of the HTR4 to control on and off of the HTR4. A source terminal and a back-gate terminal of the HTR4 are connected to VCC level, and a drain terminal thereof is connected to an output terminal 79 (hereinafter, referred to as a COM79) and to drain terminals of the LTR5 and the LTR6. The HTR4 is turned on when the output signal 74 is low, and turned off when the output signal 74 is high.

The output signal 77 is inputted to a gate terminal of the LTR5 to control on and off of the LTR5. The drain terminal of the LTR5 is connected to the COM79, a source terminal thereof is connected to ground level, and a back-gate terminal thereof is connected to −VCC level. The LTR5 is turned on when the output signal 77 is high, and turned off when the output signal 77 is low.

The output signal 78 is inputted to a gate terminal of the LTR6 to control on and off of the LTR6. The drain terminal of the LTR6 is connected to the COM79, and a source terminal and a back-gate terminal thereof are connected to −VCC level. The LTR6 is turned on when the output signal 78 is high, and turned off when the output signal 78 is low.

Operation of the circuit for generating a ternary signal of the prior art configured as described above will be described below. FIG. 8 shows operation waveforms of respective parts of the circuit for generating a ternary signal of the prior art. In the description below, "L" and "H" stand for low and high, respectively.

At the control circuit 87, when a combination of the input signals 71, 72 and 73 is [L, L, L], the output signals 74, 75 and 76 are L, L and L, respectively.

When the combination of the input signals 71, 72 and 73 is [L, L, H], the output signals 74, 75 and 76 are H, L and H, respectively.

When the combination of the input signals 71, 72 and 73 is one of [H, H, H], [H, H, L], [H, L, L], [L, H, H], [L, H, L] and [H, L, H], the output signals 74, 75 and 76 are H, H and L, respectively.

The level-shifting circuit 96 performs level conversion on the output signal 75, and outputs the output signal 77. The level-shifting circuit 95 performs level conversion on the output signal 76, and outputs the output signal 78.

When a combination of the output signals 74, 77 and 78 is [L, L, L], the HTR4 is turned on and the LTR5 and the LTR6 are turned off. In this case, an output signal of VCC level is outputted from the COM79.

When the combination of the output signals 74, 77 and 78 is [H, H, L], the HTR4 and the LTR6 are turned off and the LTR5 is turned on. In this case, an output signal of ground level is outputted from the COM79.

When the combination of the output signals 74, 77 and 78 is [H, L, H], the HTR4 and the LTR5 are turned off and the LTR6 is turned on. In this case, an output signal of −VCC level is outputted from the COM79.

According to the operation described above, the circuit for generating a ternary signal of the prior art outputs an output signal having three levels of VCC level, ground level and −VCC level, from the COM79.

BRIEF SUMMARY OF THE INVENTION

The circuit for generating a ternary signal of the prior art requires three input signals, which are the input signals 71, 72 and 73 in FIGS. 7 and 8. Therefore, in the system, such as a PDP (Plasma Display Panel) driver or the like, wherein only a high or low binary input-control signal and a high or low binary reset signal are in use, a problem that systemic change such as installation of an additional input terminal or the like is required to generate a ternary signal. In particular, in the case that the circuit for generating a ternary signal of the prior art is incorporated in a multi-channel driver that is in use for a PDP panel or the like, the circuit is complicated for the purpose of the systemic change to install the additional input terminal. The complexity of the circuit brings disadvantages for miniaturization and cost reduction of the entire device.

The main object of the present invention is to provide a circuit for generating a ternary signal which receives a binary input-control signal and a binary reset signal and outputs an appropriate ternary signal, and which is optimum for miniaturization and cost reduction. In order to solve the above-mentioned problems, the present invention has configurations described below.

According to the first aspect of the present invention, there is provided a circuit for generating a ternary signal that receives a binary input-control signal and a binary reset signal and outputs a ternary signal from an output terminal, the circuit for generating a ternary signal comprising: a first transistor being on-off controlled by a first control signal, wherein a source is connected to a high-potential-side power supply and a drain is connected to the output terminal; a second transistor being on-off controlled by a second control signal, wherein a source is connected to a first low-potential-side power supply and a drain is connected to the output terminal; a third transistor being on-off controlled by a third control signal, wherein a source is connected to a second low-potential-side power supply that is lower than the first low-potential-side power supply and a drain is connected to the output terminal; and a sequential circuit receiving the input-control signal and the reset signal, being set to an initial state when the reset signal is a first signal level, outputting the first control signal and the third control signal that make the first transistor and the third transistor be switched in a complementary manner in compliance with a level of the input-control signal in the initial state, being released from the initial state when the reset signal is switched from the first signal level to a second signal level, and outputting the second control signal and the third control signal that make the second transistor and the third transistor be switched in a complementary manner in compliance with a level of the input-control signal after a falling edge of the input-control signal is detected in a state that the sequential circuit is released from the initial state.

In accordance with this invention, an appropriate ternary signal can be outputted without modifying the system even in a system wherein only a high or low binary input-control signal and a high or low binary reset signal are in use, for example. In the case that the circuit for generating a ternary signal of the present invention is incorporated in a multi-channel driver that is in use for a PDP panel or the like, no systemic change and no circuits for installing the additional input terminal are required. Therefore, a circuit for generating a ternary signal being optimum for miniaturization and cost reduction can be realized.

According to the second aspect of the present invention, there is provided a circuit for generating a ternary signal according to the first aspect of the present invention wherein the sequential circuit includes an edge detecting circuit having an inverter for inverting the input-control signal and outputting the inverted signal as the third control signal, and a D-type flip-flop circuit for outputting an output control signal being high when a rising edge of the third control signal is detected in a state that the reset signal is low and being low when the reset signal is high; and a switching circuit outputting the first control signal and the second control signal in compliance with the output control signal and the input-control signal.

In accordance with this invention, an appropriate ternary signal can be outputted with a simple configuration in a system wherein only a high or low binary input-control signal and a high or low binary reset signal are in use, for example. Therefore, a circuit for generating a ternary signal being optimum for miniaturization and cost reduction can be realized.

According to the third aspect of the present invention, there is provided a circuit for generating a ternary signal according to the second aspect of the present invention wherein the switching circuit includes: an NAND circuit for inverting a logical sum of a inverted signal of the output control signal and the input-control signal and outputting the inverted signal as the first control signal, and an AND circuit for outputting a logical sum of the output control signal and the input control signal as the second control signal, and wherein the first transistor is a P-channel MOS transistor, the second transistor is a first N-channel MOS transistor, the third transistor is a second N-channel MOS transistor, the high-potential-side power supply is a positive potential, the first low-potential-side power supply is a zero potential, and the second low-potential-side power supply is a negative potential.

In accordance with this invention, a circuit for generating a ternary signal that outputs an appropriate ternary signal when a positive potential, a zero potential and a negative potential are respectively inputted as the high-potential-side power supply, the first low-potential-side power supply and the second low-potential-side power supply by a positive-and-negative power supply, can be realized.

According to the fourth aspect of the present invention, there is provided a circuit for generating a ternary signal according to the third aspect of the present invention, further comprising: a first level-shifting circuit that is provided between an output terminal of the inverter and a gate of the third transistor, and shifts a voltage level of a signal inputted thereto in compliance with the signal.

In accordance with this invention, the third control signal is obtained by shifting an output signal of the inverter when a positive potential, a zero potential and a negative potential are respectively inputted as the high-potential-side power supply, the first low-potential-side power supply and the second low-potential-side power supply by a positive-and-negative power supply. Thereby, a circuit for generating a ternary signal that outputs an appropriate ternary signal can be realized.

According to the fifth aspect of the present invention, there is provided a circuit for generating a ternary signal according to the third aspect of the present invention, further comprising: a first level-shifting circuit that is provided between an output terminal of the inverter and a gate of the third transistor, and shifts a voltage level of a signal inputted thereto in compliance with the signal, and a second level-shifting circuit that is provided between an output terminal of the NAND circuit and a gate of the first transistor, and shifts a voltage level of a signal inputted thereto in compliance with the signal.

In accordance with this invention, the third control signal is obtained by shifting an output signal of the inverter and the first control signal is obtained by shifting an output signal of the NAND circuit when a positive potential, a zero potential and a negative potential are respectively inputted as the high-potential-side power supply, the first low-potential-side power supply and the second low-potential-side power supply by a positive-and-negative power supply. Thereby, the positive potential can be set higher and the negative potential can be set lower, and as a result, a circuit for generating a ternary signal that is capable to be in use for a driver or the like receiving a high voltage.

According to the sixth aspect of the present invention, there is provided a circuit for generating a ternary signal according to the second aspect of the present invention, wherein the switching circuit includes: a first NAND circuit for inverting a logical sum of a inverted signal of the output control signal and the input-control signal and outputting the inverted signal as the first control signal, and a second NAND circuit for inverting a logical sum of the output control signal and the input-control signal and outputting the inverted signal as the second control signal, and wherein the first transistor is a first P-channel MOS transistor, the second transistor is a second P-channel MOS transistor, the third transistor is a N-channel MOS transistor, the high-potential-side power supply is a first positive potential, the first low-potential-side power supply is a second positive potential, and the second low-potential-side power supply is a zero potential.

In accordance with this invention, a circuit for generating a ternary signal that outputs an appropriate ternary signal when a first positive potential, a second positive potential and a zero potential are respectively inputted as the high-potential-side power supply, the first low-potential-side power supply and the second low-potential-side power supply by a positive power supply, can be realized.

According to the seventh aspect of the present invention, there is provided a circuit for generating a ternary signal according to the sixth aspect of the present invention, further comprising: a rectifier provided between the first low-potential-side power supply and a source of the second transistor.

In accordance with this invention, a highly reliable circuit for generating a ternary signal that is capable to prevent a reverse current from the first positive potential to the second positive potential from occurring when a first positive potential, a second positive potential and a zero potential are respectively inputted as the high-potential-side power supply, the first low-potential-side power supply and the second low-potential-side power supply by a positive power supply, can be realized.

According to the eighth aspect of the present invention, there is provided a circuit for generating a ternary signal according to the sixth aspect of the present invention, further comprising: a first level-shifting circuit that is provided between an output terminal of the first NAND circuit and a gate of the first transistor, and shifts a voltage level of a signal inputted thereto in compliance with the signal, and a second level-shifting circuit that is provided between an output terminal of the second NAND circuit and a gate of the second transistor, and shifts a voltage level of a signal inputted thereto in compliance with the signal.

In accordance with this invention, the first control signal is obtained by shifting an output signal from the first NAND circuit and the second control signal is obtained by shifting an output signal from the second NAND circuit when a first positive potential, a second positive potential and a zero potential are respectively inputted as the high-potential-side power supply, the first low-potential-side power supply and the second low-potential-side power supply by a positive power supply. Thereby, a circuit for generating a ternary signal that outputs an appropriate ternary signal can be realized.

The circuit for generating a ternary signal of the present invention has an effect of outputting an appropriate ternary signal without modifying the system even in a system wherein only a binary input-control signal and a binary reset signal are in use, and being optimum for miniaturization and cost reduction.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

Preferred embodiments specifically exemplifying the best mode for carrying out the present invention will be described below referring to the accompanying drawings.

First Preferred Embodiment

Figure 1:
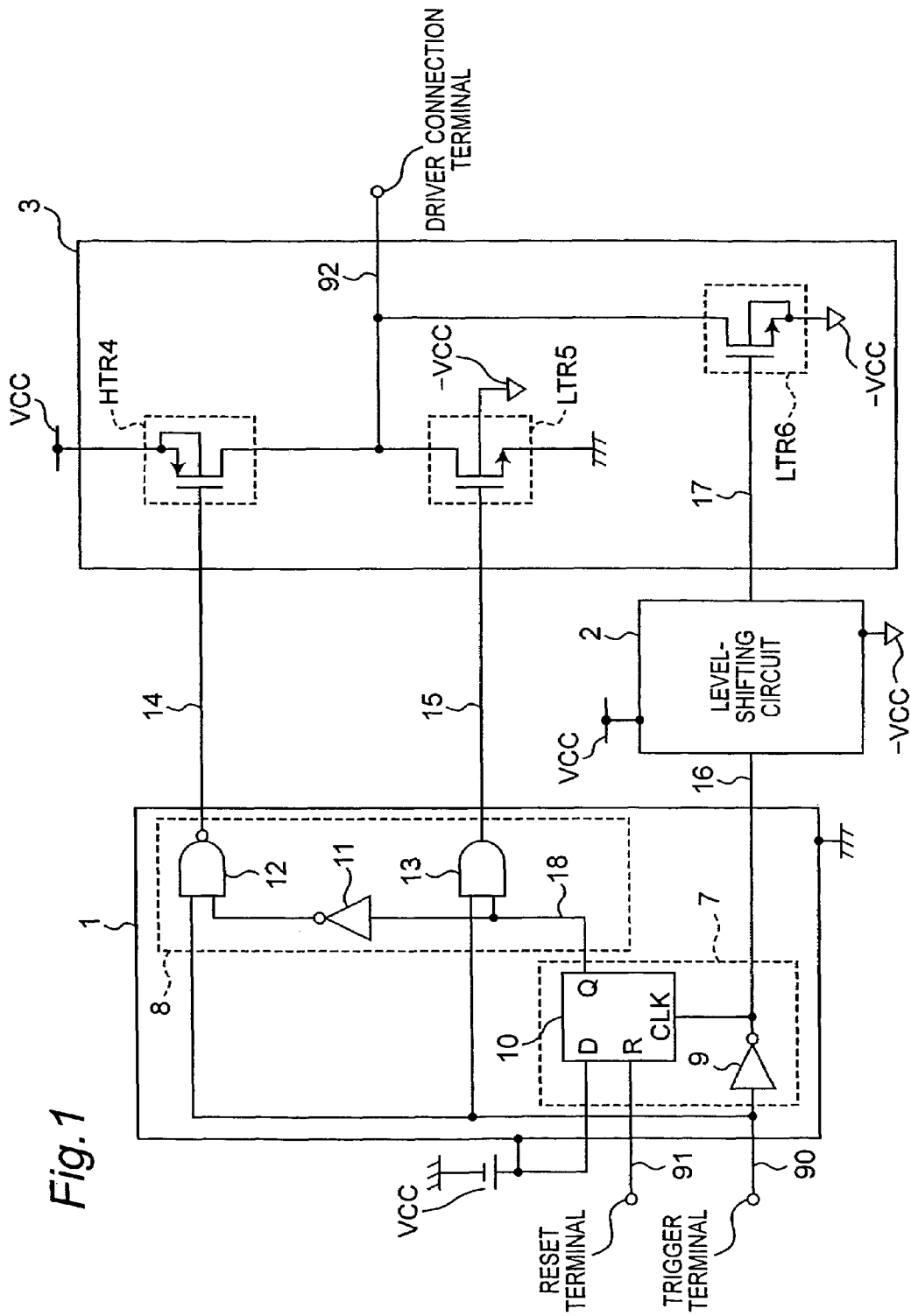
FIG. 1 is a circuit diagram showing a configuration of a circuit for generating a ternary signal in accordance with a first preferred embodiment of the present invention.
Figure 2:
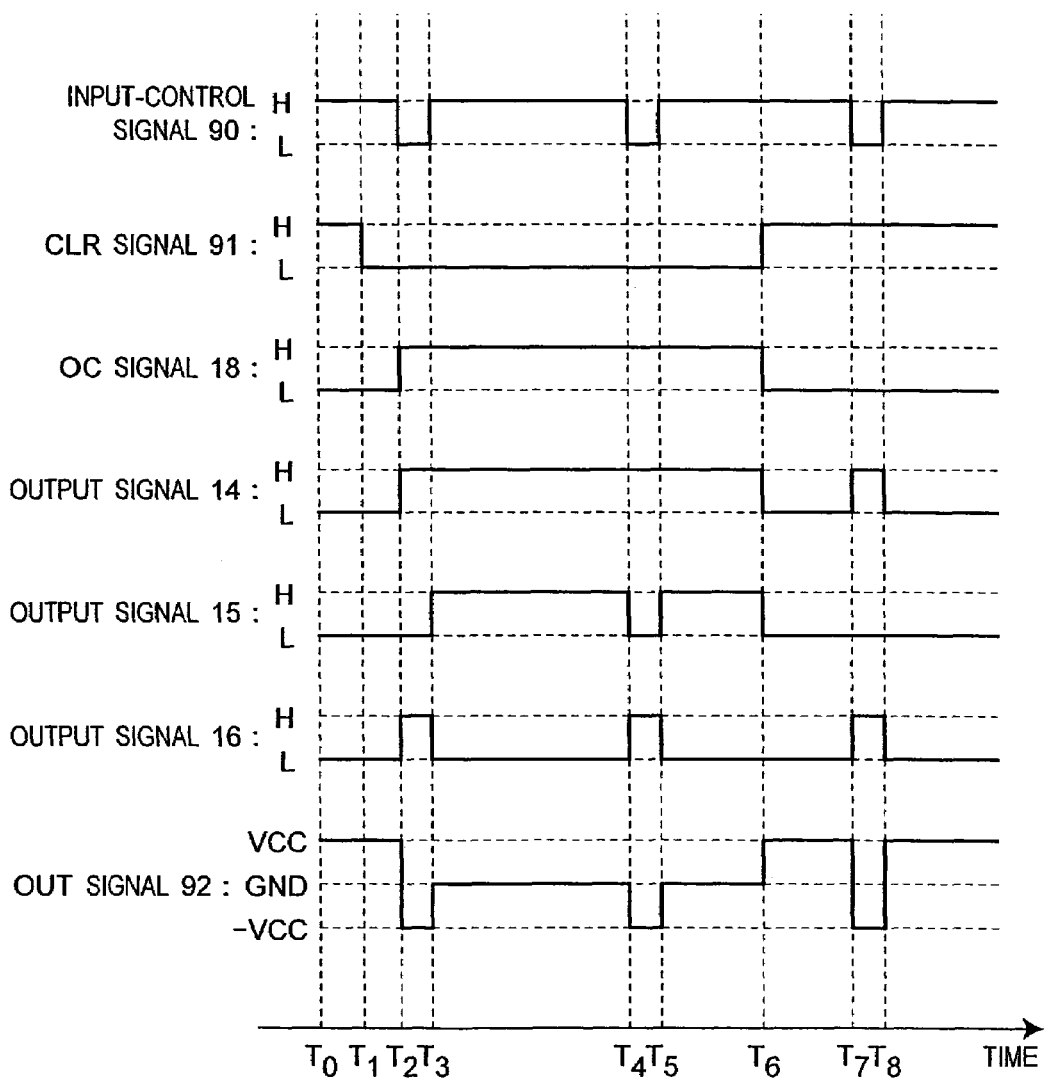
FIG. 2 is a waveform chart showing operation waveforms of respective parts of the circuit for generating a ternary signal in accordance with the first preferred embodiment of the present invention.

Referring to FIGS. 1 and 2, a circuit for generating a ternary signal in accordance with a first preferred embodiment of the present invention will be described. FIG. 1 is a circuit diagram showing a configuration of the circuit for generating a ternary signal in accordance with this first preferred embodiment of the present invention. In FIG. 1, the circuit for generating a ternary signal includes a sequential circuit 1, a level-shifting circuit 2, and a ternary output generating circuit 3.

The sequential circuit 1 includes an edge detecting circuit 7 and a switching circuit 8. The ternary output generating circuit 3 includes a high-potential-side P-channel transistor 4 (hereinafter, referred to as an HTR4), a low-potential-side N-channel transistor 5 (hereinafter, referred to as an LTR5), and a low-potential-side N-channel transistor 6 (hereinafter, referred to as an LTR6).

The edge detecting circuit 7 of the sequential circuit 1 is composed by a D-type flip-flop circuit 10 and an inverter 9.

An input terminal of the inverter 9 is connected to a trigger terminal, and an output terminal thereof is connected to a clock-signal-input terminal (CLK) (hereinafter, referred to as a CLK terminal) of the D-type flip-flop circuit 10 and the level-shifting circuit 2. The inverter 9 receives an input-control signal 90 from the trigger terminal, inverts the signal inputted thereto, and outputs the inverted signal as an output signal 16.

A data-input terminal (D) (hereinafter, referred to as a D terminal) of the D-type flip-flop circuit 10 is connected to a potential of the predetermined VCC power supply (hereinafter, referred to as VCC level), an reset-signal-input terminal (R) (hereinafter, referred to as an R terminal) thereof is connected to a reset terminal, the CLK terminal thereof is connected to the output terminal of the inverter 9, and a non-inverted output terminal (Q) (hereinafter, referred to as a Q terminal) is connected to one input terminal of an AND circuit 13 of the switching circuit 8 and an input terminal of an inverter 11 of the switching circuit 8. The D-type flip-flop circuit 10 receives a reset signal 91 (hereinafter, referred to as a CLR signal 91) from the R terminal, and outputs an output control signal 18 (hereinafter, referred to as an OC signal 18) from the Q terminal.

When the D-type flip-flop circuit 10 detects a CLR signal 91 of high level (a potential of the D terminal), which is inputted to the R terminal, the D-type flip-flop circuit 10 is set to an initial state. In the initial state, the D-type flip-flop circuit 10 outputs the OC signal 18 of low level (High-level detecting). In addition, after the CLR signal 91 is switched from high level to low level (ground level) and then the initial state is canceled, the D-type flip-flop circuit 10 is triggered to output the OC signal 18 of high level when the D-type flip-flop circuit 10 detects a rising edge of the output signal 16 from the inverter 9 (Rising edge detecting). The OC signal 18 that became high level once is kept in high level until the CLR signal 91 of high level is inputted to the D-type flip-flop circuit 10 and the D-type flip-flop circuit 10 is set to an initial state again.

The switching circuit 8 of the sequential circuit 1 consists of the AND circuit 13, the inverter 11, and an NAND circuit 12.

One input terminal of the AND circuit 13 is connected to the Q terminal of the D-type flip-flop circuit 10, and the other input terminal thereof is connected to the trigger terminal. The AND circuit 13 receives the input-control signal 90 from the trigger terminal and the OC signal 18 from the D-type flip-flop circuit 10, and outputs a logical sum of both signals as an output signal 15.

The input terminal of the inverter 11 is connected to the Q terminal of the D-type flip-flop circuit 10, and an output terminal thereof is connected to one input terminal of the NAND circuit 12. The inverter 11 receives the OC signal 18 from the D-type flip-flop circuit 10, inverts the signal inputted thereto, and outputs the inverted signal.

One input terminal of the NAND circuit 12 is connected to the output terminal of the inverter 11, the other input terminal thereof is connected to the trigger terminal, and an output terminal thereof is connected to a gate terminal of the HTR4. The NAND circuit 12 receives the output signal from the inverter 11 and the input-control signal 90 from the trigger terminal, inverts a logical sum of both signals, and outputs the inverted signal as an output signal 14.

The level-shifting circuit 2 is connected to VCC level, a negative potential of the VCC power supply (hereinafter, referred to as –VCC level), the output terminal of the inverter 9, and a gate terminal of the LTR6. The level-shifting circuit 2 receives the output signal 16 from the inverter 9. The level-shifting circuit 2 outputs a high output signal 17 of VCC level when the output signal 16 is in high level (VCC level), and outputs a low output signal 17 of –VCC level when the output signal 16 is in low level (ground level). The output signal 16 and the output signal 17 differ from each other in voltage level.

The gate terminal of the HTR4 of the ternary output generating circuit 3 is connected to the output terminal of the NAND circuit 12, a source terminal and a back-gate terminal thereof are connected to VCC level, and the drain terminal thereof is connected to a driver connection terminal and to drain terminals of the LTR5 and the LTR6. The output signal 14 outputted from the NAND circuit 12 controls on (conductive state, or close) and off (non-conductive state, or open) of the HTR4. The HTR4 is turned on when the output signal 14 is low, and turned off when the output signal 14 is high.

A gate terminal of the LTR5 of the ternary output generating circuit 3 is connected to the output terminal of the AND circuit 13, the drain terminal thereof is connected to the driver connection terminal, a source terminal thereof are connected to ground level, and a back-gate terminal thereof is connected to –VCC level. The output signal 15 controls on (conductive state, or close) and off (non-conductive state, or open) of the LTR5. The LTR5 is turned on when the output signal 15 is high, and turned off when the output signal 15 is low.

A gate terminal of the LTR6 of the ternary output generating circuit 3 is connected to the level-shifting circuit 2, a drain terminal thereof is connected to the driver connection terminal, and a source terminal and a back-gate terminal thereof is connected to –VCC level. The output signal 17 outputted from the level-shifting circuit 2 controls on (conductive state, or close) and off (non-conductive state, or open) of the LTR6. The LTR6 is turned on when the output signal 17 is high, and turned off when the output signal 17 is low.

Operation of the circuit for generating a ternary signal of this first preferred embodiment of the present invention configured as described above will be described below. FIG. 2 shows operation waveforms of respective parts of the circuit for generating a ternary signal of this first preferred embodiment of the present invention shown in FIG. 1. In FIG. 2, illustration is made on operation waveforms of the signal to be inputted from the trigger terminal (the input-control signal 90), the signal to be inputted from the reset terminal (the CLR signal 91), the signal to be outputted from the Q terminal of the D-type flip-flop circuit 10 of the edge detecting circuit 7 (the OC signal 18), the signal to be outputted from the NAND circuit 12 of the switching circuit 8 (the output signal 14), the signal to be outputted from the AND circuit 13 of the switching circuit 8 (the output signal 15), the signal to be outputted from the inverter 9 of the edge detecting circuit 7 (the output signal 16), and the signal to be outputted from the driver connection terminal (an OUT signal 92).

The circuit for generating a ternary signal of this first preferred embodiment of the present invention receives the high or low binary input-control signal 90 and the high or low binary CLR signal 91 as shown in FIG. 2. In this first preferred embodiment, VCC level is in use as high level of the input-control signal 90 and the CLR signal 91, and ground level is in use as low level of the input-control signal 90.

The input-control signal 90 and the CLR signal 91 are inputted to the sequential circuit 1. The sequential circuit 1 processes the input-control signal 90 in compliance with the CLR signal 91 at the edge detecting circuit 7 and the switching circuit 8, and outputs the output signals 14, 15 and 16.

The inverter 9 of the edge detecting circuit 7 inverts the inputted input-control signal 90, and outputs the inverted signal as the output signal 16. In FIG. 2, since the input-control signal 90 is in low level during a time period from timing T2 to timing T3, a time period from timing T4 to timing T5, and a time period from timing T7 to timing T8, the output signal 16 is in high level during the same time periods.

The initial state of the OC signal 18, which is is outputted from the Q terminal of the D-type flip-flop circuit 10 of the edge detecting circuit 7, is in low level. When the CLR signal 91, which is inputted from the reset terminal, is in high level, the D-type flip-flop circuit 10 is set to an initial state, and at the same time, the OC signal 18 is switched to low level (during a time period from timing T0 to timing T1). When the CLR signal 91 is switched from high level to low level and then the D-type flip-flop circuit 10 is released from the initial state (at timing T1 of FIG. 2). After that, when rising edge of the output signal 16 from the inverter 9 is detected, the D-type flip-flop circuit 10 is triggered, and at the same time, the OC signal 18 is set to high level (at timing T2 of FIG. 2). The OC signal 18 is kept in high level until next. CLR signal 91 of high level is detected (during a time period from timing T2 to timing T6 in FIG. 2).

The AND circuit 13 of the switching circuit 8 of the sequential circuit 1 receives the input-control signal 90 and the OC signal 18, and outputs the output signal 15. The output signal 15 is set to low level when at least one of the input-control signal 90 and the OC signal 18 is in low level (during a time period before timing T3, a time period from timing T4 to timing T5, and a time period after timing T6). The output signal 15 is set to high level when both the input-control signal 90 and the OC signal 18 are in high level (during a time period from timing T3 to timing T4 and a time period from timing T5 to timing T6).

The NAND circuit 12 receives the inverted signal of the OC signal 18 and the input-control signal 90, and outputs the output signal 14. The output signal 14 is set to high level when at least one of the inverted signal of the OC signal 18 and the input-control signal 90 is in low level (during a time period from timing T2 to timing T6 and a time period from timing T7 and timing T8). The output signal 14 is set to low level when both the inverted signal of the OC signal 18 and the input-control signal 90 are in high level (during a time period before timing T2, a time period from timing T6 and timing T7, and a time period after timing T8).

The output signal 16 from the sequential circuit 1 is inputted to the level-shifting circuit 2 and performed level conversion thereon, and then outputted as the output signal 17. The output signal 16 and the output signal 17 differ from each other in voltage level, but their waveforms are almost same to each other.

The output signals 14 and 15 from the sequential circuit 1 and the output signal 17 from the level-shifting circuit 2 are inputted to the ternary output generating circuit 3, respectively. The output signal 14 controls the HTR4 of the ternary output generating circuit 3, the output signal 15 controls the LTR5 of the ternary output generating circuit 3, and the output signal 16 controls the LTR6 of the ternary output generating circuit 3.

According to the above-mentioned operation, the respective output signals 14, 15 and 17, which are outputted from the sequential circuit 1 and the level-shifting circuit 2, and the input-control signal 90 and the OC signal 18 have relations as follows. In addition, "L" and "H" stand for low and high, respectively.

When a combination of the input-control signal 90 and the OC signal 18 is [H, H], the output signals 14, 15 and 17 are H, H and L, respectively.

When the combination of the input-control signal 90 and the OC signal 18 is [H, L], the output signals 14, 15 and 17 are L, L and L, respectively.

When the combination of the input-control signal 90 and the OC signal 18 is [L, H] or [L, L], the output signals 14, 15 and 17 are H, L and H, respectively.

In addition, the output signals 14, 15 and 17, and the OUT signal 92, which is outputted from the driver connection terminal, have relations as follows.

When a combination of the output signals 14, 15 and 17 is [L, L, L], the HTR4 is turned on, and the LTR5 and the LTR6 are turned off. In this case, since a signal of VCC level at the source terminal of the HTR4 is applied to the driver connection terminal, the OUT signal 92 of VCC level is outputted from the driver connection terminal.

When the combination of the output signals 14, 15 and 17 is [H, H, L], the LTR5 is turned on, and the HTR4 and the LTR6 are turned off. In this case, since a signal of ground level at the source terminal of the LTR5 is applied to the driver connection terminal, the OUT signal 92 of ground level is outputted from the driver connection terminal.

When the combination of the output signals 14, 15 and 17 is [H, L, H], the LTR6 is turned on, and the HTR4 and the LTR5 are turned off. In this case, since a signal of −VCC level at the source terminal of the LTR6 is applied to the driver connection terminal, the OUT signal 92 of −VCC level is outputted from the driver connection terminal.

Therefore, the HTR4 and the LTR6 are switched in a complementary manner in compliance with the input-control signal 90 when the OC signal 18 is in low level. The LTR5 and the LTR6 are switched in a complementary manner in compliance with the input-control signal 90 when the OC signal 18 is in high level. This leads that a ternary signal is outputted from the driver connection terminal.

As described above, the circuit for generating a ternary signal in accordance with this first preferred embodiment of the present invention can output a ternary signal of VCC level, ground level and −VCC level in the case that a high or low binary input-control signal and a high or low binary reset signal are inputted thereto. According to the circuit for generating a ternary signal in accordance with this first preferred embodiment of the present invention, a circuit for generating a ternary signal which outputs an appropriate ternary signal without modifying the system even in a system wherein only a binary input-control signal and a binary reset signal are used and is optimum for miniaturization and cost reduction, can be realized.

In addition, in this first preferred embodiment of the present invention, the level-shifting circuit 2 is provided between the output terminal of the inverter 9 and the gate terminal of the LTR6. However, the configuration of the embodiment is not limited to this configuration. And in the case that the sequential circuit 1 is not connected to ground level but connected to −VCC level, the similar effect as in this first preferred embodiment of the present invention, such that a ternary signal of VCC level, ground level and −VCC level is outputted, can be obtained without providing the level-shifting circuit 2.

Second Preferred Embodiment

Figure 3:
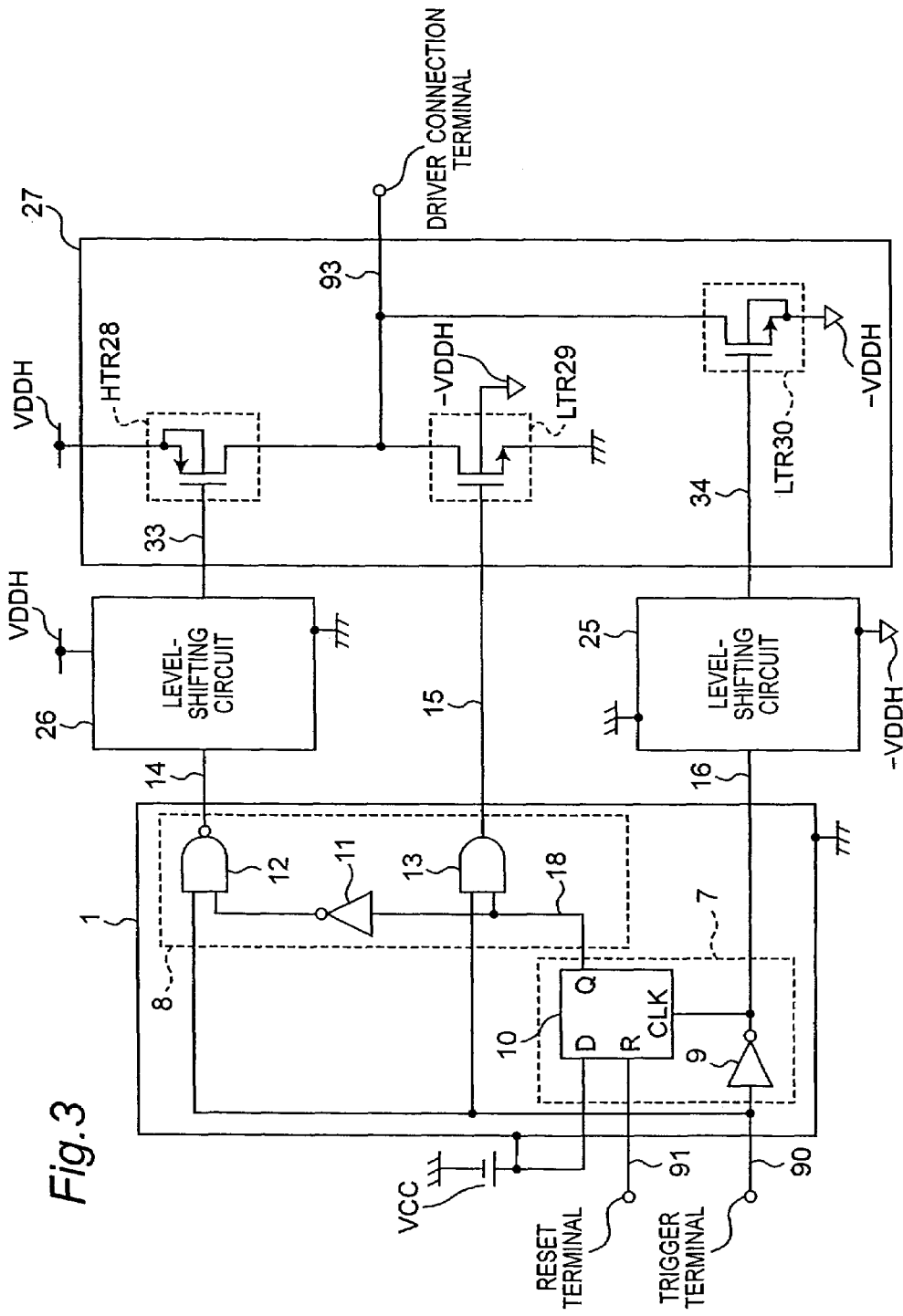
FIG. 3 is a circuit diagram showing a configuration of a circuit for generating a ternary signal in accordance with a second preferred embodiment of the present invention.
Figure 4:
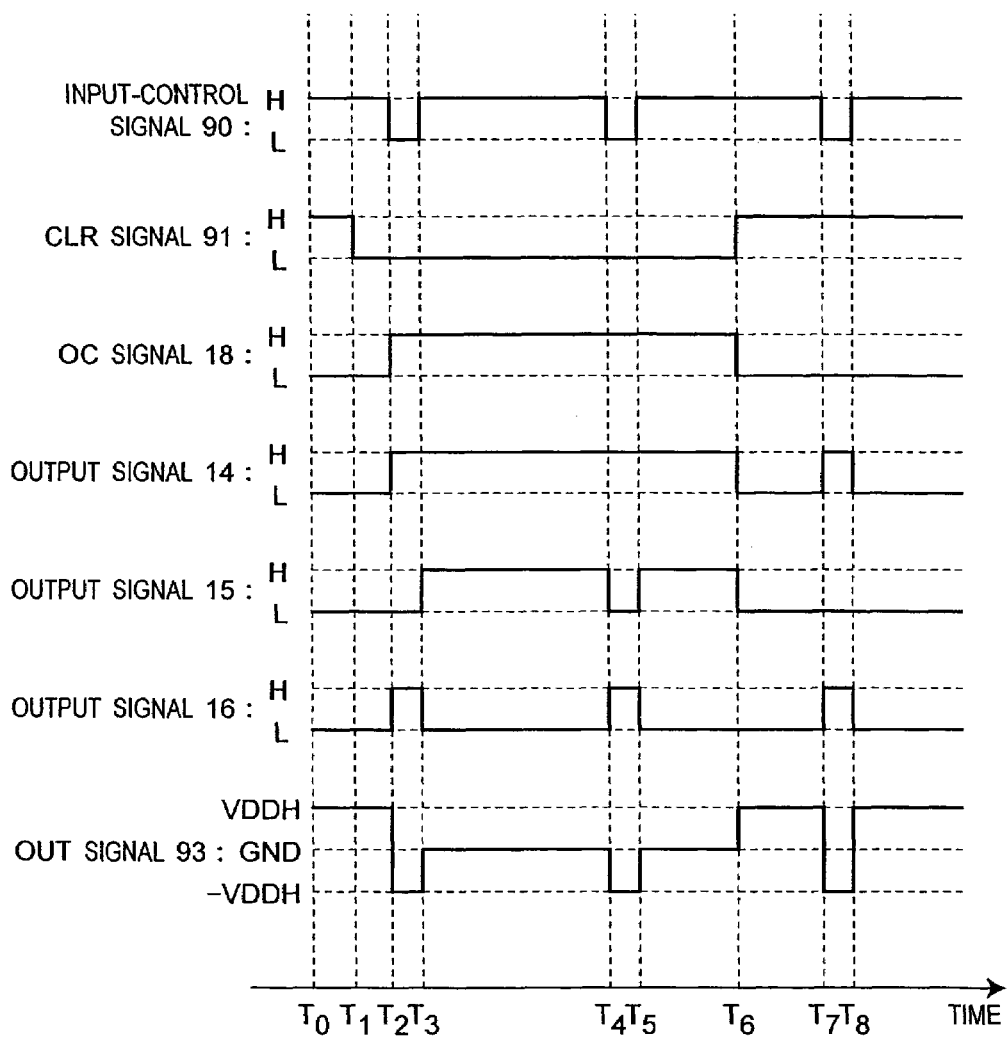
FIG. 4 is a waveform chart showing operation waveforms of respective parts of the circuit for generating a ternary signal in accordance with the second preferred embodiment of the present invention.

Referring to FIGS. 3 and 4, a circuit for generating a ternary signal in accordance with a second preferred embodiment of the present invention will be described. FIG. 3 is a circuit diagram showing a configuration of the circuit for generating a ternary signal in accordance with this second preferred embodiment of the present invention. In FIG. 3, the circuit for generating a ternary signal in accordance with this second preferred embodiment of the present invention is different from that of the first preferred embodiment of the present invention shown in FIG. 1 in that a level-shifting circuit 25 is provided instead of the level-shifting circuit 2, a ternary output generating circuit 27 is provided instead of the ternary output generating circuit 3, and a level-shifting circuit 26 is added.

Figure 7:
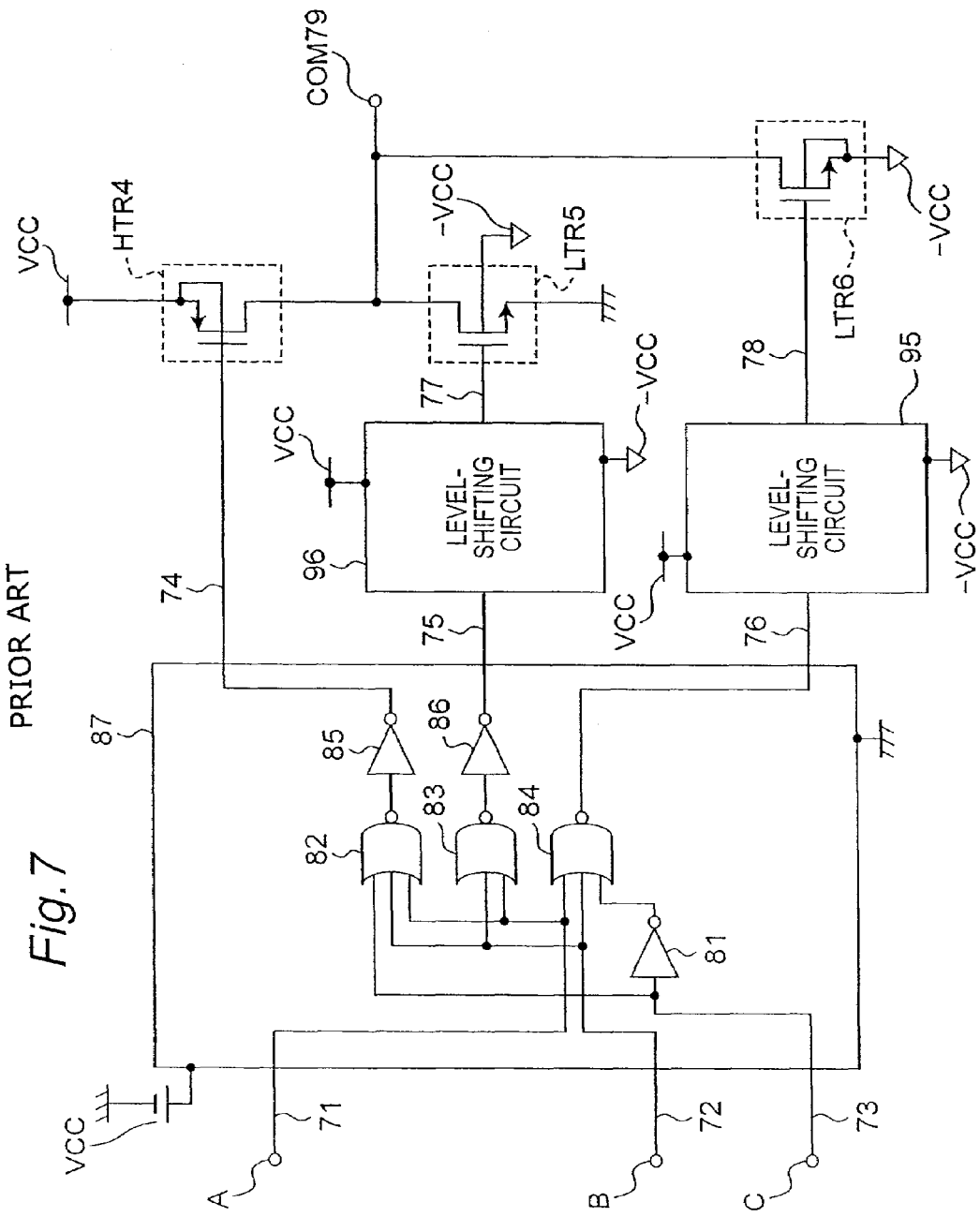
FIG. 7 is a circuit diagram showing a configuration of a circuit for generating a ternary signal of a prior art.
Figure 8:
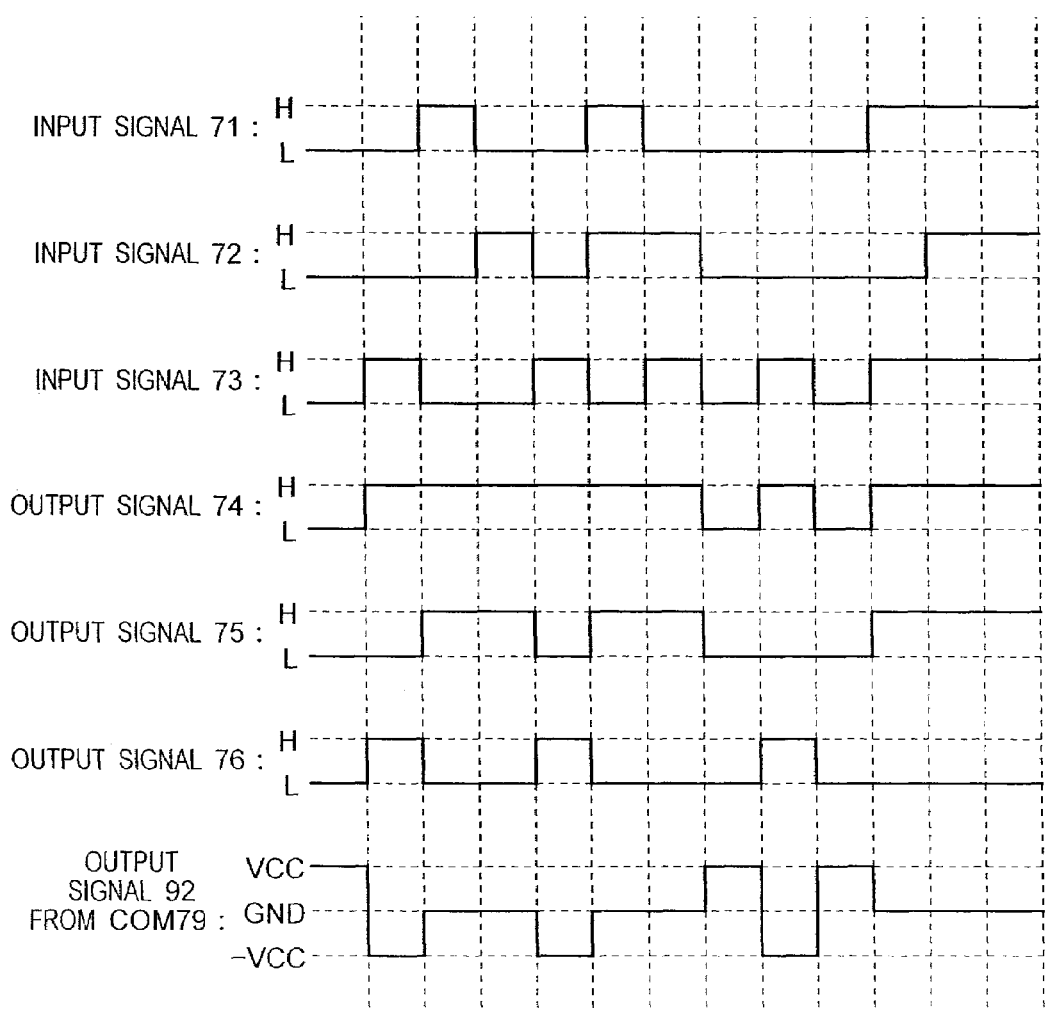
FIG. 8 is a waveform chart showing operation waveforms of respective parts of the circuit for generating a ternary signal of the prior art.

In the circuit for generating a ternary signal of the prior art shown in FIG. 7 and in the circuit for generating a ternary signal in accordance with the first preferred embodiment shown in FIG. 1, CMOS circuit or the like wherein a relatively low VCC level (e.g. approximately 10V) is in use as a power supply voltage is operated. On the other hand, in the circuit for generating a ternary signal in accordance with this second preferred embodiment, a circuit wherein a voltage that is much higher than VCC level (e.g. 100V or more) is in use as a power supply voltage can be operated. In other respects, the configuration is similar to that of the first preferred embodiment. Components similar or equivalent to those of the first preferred embodiment are designated by the same numeral references, and their descriptions are omitted.

The ternary output generating circuit 27 includes a high-potential-side P-channel transistor 28 (hereinafter, referred to as an HTR28), a low-potential-side N-channel transistor 29 (hereinafter, referred to as an LTR29), and a low-potential-side N-channel transistor 30 (hereinafter, referred to as an LTR30).

The level-shifting circuit 26 is connected to ground level, a positive-side high-voltage-power-supply input terminal (hereinafter, referred to as VDDH terminal), the output terminal of the NAND circuit 12, and a gate terminal of the HTR28. The level-shifting circuit 26 receives the output signal 14 from the NAND circuit 12. The level-shifting circuit 26 outputs a high output signal 33 of a potential level at the VDDH terminal (hereinafter, referred to as VDDH level) when the output signal 14 is in high level (VCC level), and outputs a low output signal 33 of ground level when the output signal 14 is in low level (ground level). The output signal 14 and the output signal 33 differ from each other in voltage level. VDDH level is set to a voltage that is higher than a potential of VCC level in the circuit for generating a ternary signal of the prior art shown in FIG. 7 and in the circuit for generating a ternary signal in accordance with the first preferred embodiment shown in FIG. 1.

The level-shifting circuit 25 is connected to ground level, a negative-side high-voltage-power-supply input terminal (hereinafter, referred to as −VDDH terminal), the output terminal of the inverter 9, and a gate terminal of the LTR30. The level-shifting circuit 25 receives the output signal 16 from the inverter 9. The level-shifting circuit 25 outputs a high output signal 34 of ground level when the output signal 16 is in high level (VCC level), and outputs a low output signal 34 of potential level at the −VDDH terminal (hereinafter, referred to as −VDDH level) when the output signal 16 is in low level (ground level). The output signal 16 and the output signal 34 differ from each other in voltage level. −VDDH level is equal to the negative potential of the potential at the VDDH terminal.

The gate terminal of the HTR28 of the ternary output generating circuit 27 is connected to the level-shifting circuit 26, a source terminal and a back-gate terminal thereof are connected to VDDH level, and a drain terminal thereof is connected to the driver connection terminal and to drain terminals of the LTR29 and the LTR30. The output signal 33 outputted from the level-shifting circuit 26 controls on (conductive state, or close) and off (non-conductive state, or open) of the HTR28. The HTR28 is turned on when the output signal 33 is low, and turned off when the output signal 33 is high.

A gate terminal of the LTR29 of the ternary output generating circuit 27 is connected to the output terminal of the AND circuit 13, the drain terminal thereof is connected to the driver connection terminal, a source terminal thereof are connected to ground level, and a back-gate terminal thereof is connected to −VDDH level. The output signal 15 controls on (conductive state, or close) and off (non-conductive state, or open) of the LTR29. The LTR29 is turned on when the output signal 15 is high, and turned off when the output signal 15 is low.

The gate terminal of the LTR30 of the ternary output generating circuit 27 is connected to the level-shifting circuit 25, the drain terminal thereof is connected to the driver connection terminal, and a source terminal and a back-gate terminal thereof are connected to −VDDH level. The output signal 34 outputted from the level-shifting circuit 25 controls on (conductive state, or close) and off (non-conductive state, or open) of the LTR30. The LTR30 is turned on when the output signal 34 is high, and turned off when the output signal 34 is low.

Operation of the circuit for generating a ternary signal of this second preferred embodiment of the present invention configured as described above will be described below. FIG. 4 shows operation waveforms of respective parts of the circuit for generating a ternary signal of this second preferred embodiment of the present invention shown in FIG. 3. In FIG. 4, illustration is made on operation waveforms of the signal to be inputted from the trigger terminal (the input-control signal 90), the signal to be inputted from the reset terminal (the CLR signal 91), the signal to be outputted from the Q terminal of the D-type flip-flop circuit 10 of the edge detecting circuit 7 (the OC signal 18), the signal to be outputted from the NAND circuit 12 of the switching circuit 8 (the output signal 14), the signal to be outputted from the AND circuit 13 of the switching circuit 8 (the output signal 15), the signal to be outputted from the inverter 9 of the edge detecting circuit 7 (the output signal 16), and the signal to be outputted from the driver connection terminal (an OUT signal 93).

The circuit for generating a ternary signal of this second preferred embodiment of the present invention receives the high or low binary input-control signal 90 and the high or low binary CLR signal 91 as shown in FIG. 4. In this second preferred embodiment, VCC level is in use as high level of the input-control signal 90 and the CLR signal 91, and ground level is in use as low level of the input-control signal 90.

The input-control signal 90 and the CLR signal 91 are inputted to the sequential circuit 1. The sequential circuit 1 processes the input-control signal 90 in compliance with the CLR signal 91 at the edge detecting circuit 7 and the switching circuit 8, and outputs the output signals 14, 15 and 16. The operations of the output signals 14, 15 and 16 are similar to those of the circuit for generating a ternary signal of this first preferred embodiment of the present invention shown in FIG. 2, their overlapped descriptions will be omitted.

The output signal 16 from the sequential circuit 1 is inputted to the level-shifting circuit 25 and performed level conversion thereon, and then outputted as the output signal 34. The output signal 16 and the output signal 34 differ from each other in voltage level, but their waveforms are almost same to each other. The output signal 14 from the sequential circuit 1 is inputted to the level-shifting circuit 26 and performed level conversion thereon, and then outputted as the output signal 33. The output signal 14 and the output signal 33 differ from each other in voltage level, but their waveforms are almost same to each other.

The output signal 33 from the level-shifting circuit 26, the output signal 15 from the sequential circuit 1, and the output signal 34 from the level-shifting circuit 25 are inputted to the ternary output generating circuit 27, respectively. The output signal 33 controls the HTR28 of the ternary output generating circuit 27, the output signal 15 controls the LTR29 of the ternary output generating circuit 27, and the output signal 34 controls the LTR30 of the ternary output generating circuit 27.

According to the above-mentioned operation, the respective output signals 33, 15 and 34, which are outputted from the level-shifting circuit 26, the sequential circuit 1, and the level-shifting circuit 25, and the input-control signal 90 and the OC signal 18 have relations as follows.

When a combination of the input-control signal 90 and the OC signal 18 is [H, H], the output signals 33, 15 and 34 are H, H and L, respectively.

When the combination of the input-control signal 90 and the OC signal 18 is [H, L], the output signals 33, 15 and 34 are L, L and L, respectively.

When the combination of the input-control signal 90 and the OC signal 18 is [L, H] or [L, L], the output signals 33, 15 and 34 are H, L and H, respectively.

In addition, the output signals 33, 15 and 34, and the OUT signal 93, which is outputted from the driver connection terminal, have relations as follows.

When a combination of the output signals 33, 15 and 34 is [L, L, L], the HTR28 is turned on, and the LTR29 and the LTR30 are turned off. In this case, since a signal of VDDH level at the source terminal of the HTR28 is applied to the driver connection terminal, the OUT signal 93 of VDDH level is outputted from the driver connection terminal.

When the combination of the output signals 33, 15 and 34 is [H, H, L], the LTR29 is turned on, and the HTR28 and the LTR30 are turned off. In this case, since a signal of ground level at the source terminal of the LTR29 is applied to the driver connection terminal, the OUT signal 93 of ground level is outputted from the driver connection terminal.

When the combination of the output signals 33, 15 and 34 is [H, L, H], the LTR30 is turned on, and the HTR28 and the LTR29 are turned off. In this case, since a signal of –VDDH level at the source terminal of the LTR29 is applied to the driver connection terminal, the OUT signal 93 of –VDDH level is outputted from the driver connection terminal.

Therefore, the HTR28 and the LTR30 are switched in a complementary manner in compliance with the input-control signal 90 when the OC signal 18 is in low level. The LTR29 and the LTR30 are switched in a complementary manner in compliance with the input-control signal 90 when the OC signal 18 is in high level. This leads that a ternary signal is outputted from the driver connection terminal.

As described above, the circuit for generating a ternary signal in accordance with this second preferred embodiment of the present invention can output a ternary signal of VDDH level, ground level and –VDDH level in the case that a high or low binary input-control signal and a high or low binary reset signal are inputted thereto. According to the circuit for generating a ternary signal in accordance with this second preferred embodiment of the present invention, a circuit for generating a ternary signal that operates a circuit wherein a voltage much higher than the VCC level in the circuit for generating a ternary signal of the prior art shown in FIG. 7 and in the circuit for generating a ternary signal in accordance with the first preferred embodiment of the present invention shown in FIG. 1 is in use as a power supply voltage, can be realized.

Third Preferred Embodiment

Figure 5:
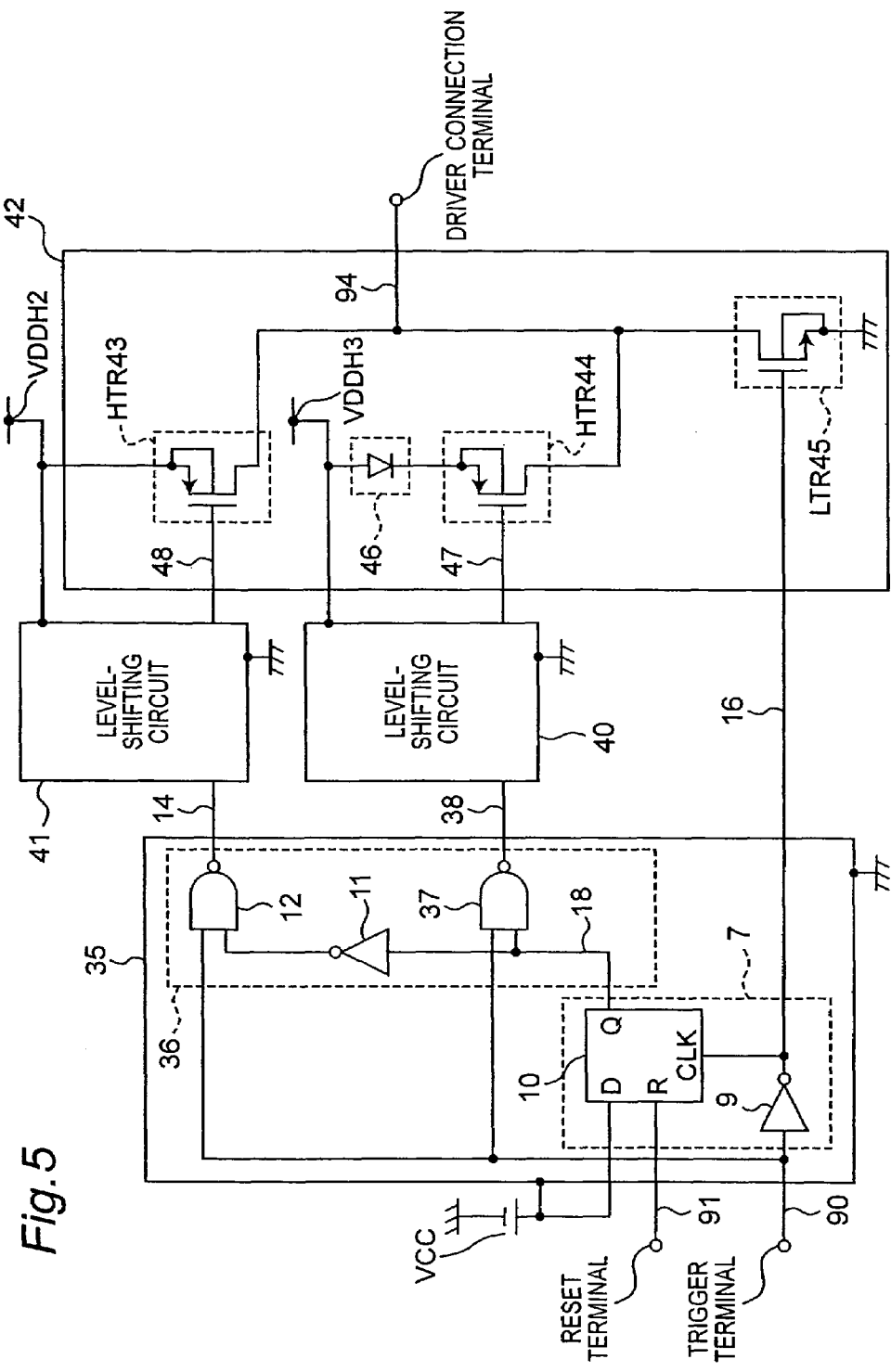
FIG. 5 is a circuit diagram showing a configuration of a circuit for generating a ternary signal in accordance with a third preferred embodiment of the present invention.
Figure 6:
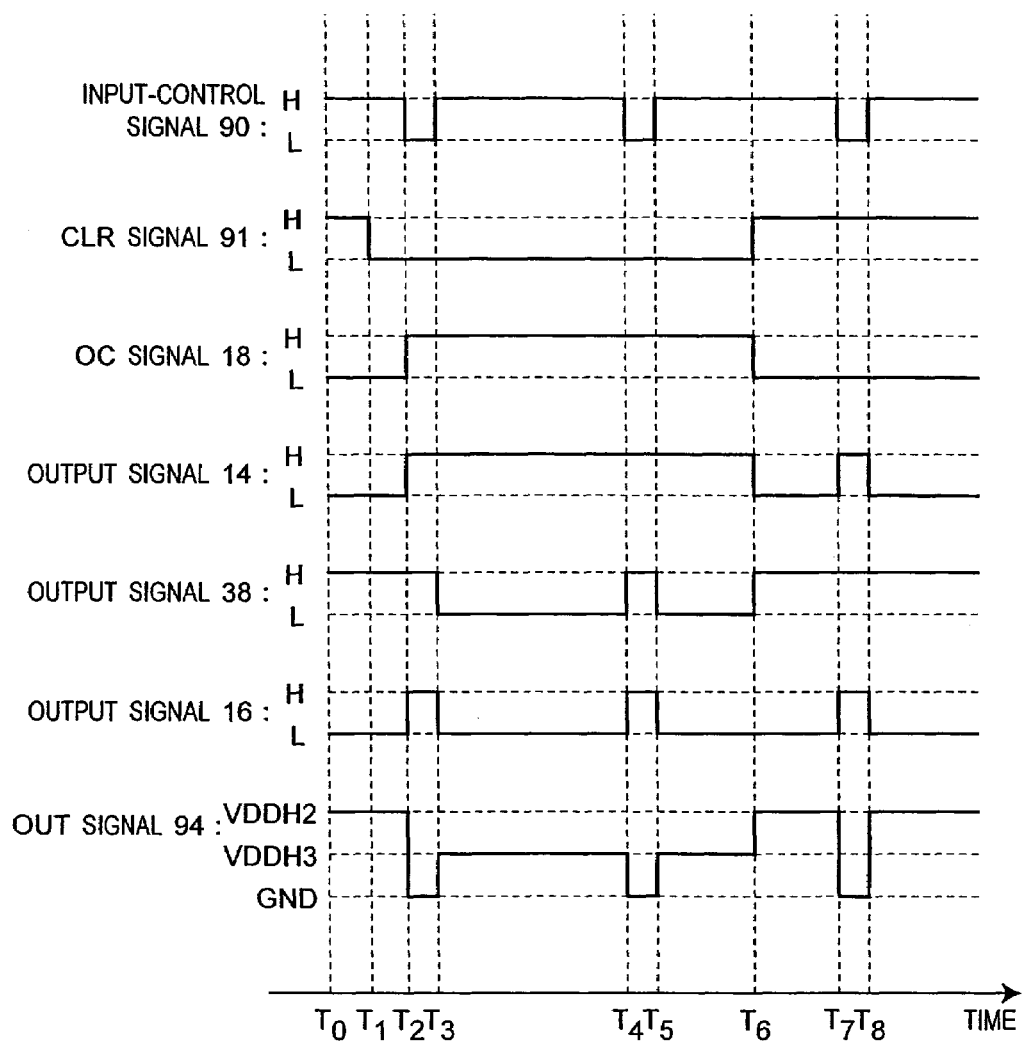
FIG. 6 is a waveform chart showing operation waveforms of respective parts of the circuit for generating a ternary signal in accordance with the third preferred embodiment of the present invention.

Referring to FIGS. 5 and 6, a circuit for generating a ternary signal in accordance with a third preferred embodiment of the present invention will be described. FIG. 5 is a circuit diagram showing a configuration of the circuit for generating a ternary signal in accordance with this third preferred embodiment of the present invention. In FIG. 5, the circuit for generating a ternary signal in accordance with this third preferred embodiment of the present invention is different from that of the first preferred embodiment of the present invention shown in FIG. 1 in that a sequential circuit 35 is provided instead of the sequential circuit 1, the level-shifting circuit 2 is removed, level-shifting circuit 40 and 41 are added, and a ternary output generating circuit 42 is provided instead of the ternary output generating circuit 3.

In the circuit for generating a ternary signal of the prior art shown in FIG. 7 and in the circuit for generating a ternary signal in accordance with the first preferred embodiment shown in FIG. 1, a positive-and-negative power supply is in use as a power supply. On the other hand, in the circuit for generating a ternary signal in accordance with this third preferred embodiment, ground level is set as the lowest potential; and a positive power supply is in use as a power supply. In other respects, the configuration is similar to that of the first preferred embodiment. Components similar or equivalent to those of the first preferred embodiment are designated by the same numeral references, and their descriptions are omitted.

The sequential circuit 35 is different from the sequential circuit 1 in accordance with the first preferred embodiment of the present invention in that a switching circuit 36 is provided instead of the switching circuit 8. The description of the edge detecting circuit 7 having a similar configuration to that in the first preferred embodiment of the present invention will be omitted.

The ternary output generating circuit 42 includes a high-potential-side P-channel transistor 43 (hereinafter, referred to as an HTR43), a high-potential-side P-channel transistor 44 (hereinafter, referred to as an HTR44), a low-potential-side N-channel transistor 45 (hereinafter, referred to as an LTR45), and a diode 46 for preventing a reverse current.

The switching circuit 36 of the sequential circuit 35 consists of the inverter 11, the NAND circuit 12, and an NAND circuit 37.

One input terminal of the NAND circuit 37 is connected to the Q terminal of the D-type flip-flop circuit 10, the other input terminal thereof is connected to the trigger terminal, and an output terminal thereof is connected to the level-shifting circuit 40. The NAND circuit 37 receives the input-control signal 90 from the trigger terminal and the OC signal 18 from the D-type flip-flop circuit 10, inverts a logical sum of both signals, and outputs the inverted signal as an output signal 38. Since the inverter 11 and the NAND circuit 12 are similar to those in the first preferred embodiment of the present invention, their description will be omitted.

The level-shifting circuit 41 is connected to a second high-voltage-power-supply input terminal (hereinafter, referred to as VDDH2 terminal), ground level, the output terminal of the NAND circuit 12, and a gate terminal of the HTR43. The level-shifting circuit 41 receives the output signal 14 from the NAND circuit 12. The level-shifting circuit 41 outputs a high output signal 48 of a potential level at the VDDH2 terminal (hereinafter, referred to as VDDH2 level) when the output signal 14 is in high level (VCC level), and outputs a low output signal 48 of ground level when the output signal 14 is in low level (ground level). The output signal 14 and the output signal 48 differ from each other in voltage level.

The level-shifting circuit 40 is connected to a third high-voltage-power-supply input terminal (hereinafter, referred to as VDDH3 terminal), ground level, the output terminal of the NAND circuit 37, and a gate terminal of the HTR44. The level-shifting circuit 40 receives the output signal 38 from the NAND circuit 37. The level-shifting circuit 40 outputs a high output signal 47 of a potential level at the VDDH3 terminal (hereinafter, referred to as VDDH3 level) when the output signal 38 is in high level (VCC level), and outputs a low output signal 47 of potential level at ground level when the output signal 38 is in low level (ground level). The output signal 38 and the output signal 47 differ from each other in voltage level.

The gate terminal of the HTR43 of the ternary output generating circuit 42 is connected to the level-shifting circuit 41, a source terminal and a back-gate terminal thereof are connected to VDDH2 level, and a drain terminal thereof is connected to the driver connection terminal. The output signal 48 outputted from the level-shifting circuit 41 controls on (conductive state, or close) and off (non-conductive state, or open) of the HTR43. The HTR43 is turned on when the output signal 48 is low, and turned off when the output signal 48 is high.

The gate terminal of the HTR44 of the ternary output generating circuit 42 is connected to the level-shifting circuit 40, a drain terminal thereof is connected to the driver connection terminal, and a source terminal and a back-gate terminal thereof are connected to VDDH3 level through the diode 46. The output signal 47 outputted from the level-shifting circuit 40 controls on (conductive state, or close) and off (non-conductive state, or open) of the HTR44. The HTR44 is turned on when the output signal 47 is low, and turned off when the output signal 47 is high.

A gate terminal of the LTR45 of the ternary output generating circuit 42 is connected to the output terminal of the inverter 9 of the sequential circuit 35, a drain terminal thereof is connected to the driver connection terminal, and a source terminal and a back-gate terminal thereof are connected to ground level. The output signal 16 outputted from the inverter 9 controls on (conductive state, or close) and off (non-conductive state, or open) of the LTR45. The LTR45 is turned on when the output signal 16 is high, and turned off when the output signal 16 is low.

In addition, VDDH2 level, VDDH3 level and VCC level, which are the power supply of the circuit for generating a ternary signal in accordance with this third preferred embodiment, have a relationship of VDDH2>VDDH3>VCC.

An anode terminal of the diode 46 is connected to the VDDH3 level, and a cathode terminal thereof is connected to the source terminal and the back-gate terminal of the HTR44. Although a current from the anode terminal to the cathode terminal of the diode 46 flows, a current from the cathode terminal to the anode terminal of the diode 46 does not flow. The diode 46 prevents the reverse current flowing from the HTR44 to the VDDH3 level.

Operation of the circuit for generating a ternary signal of this third preferred embodiment of the present invention configured as described above will be described below. FIG. 6 shows operation waveforms of respective parts of the circuit for generating a ternary signal of this third preferred embodiment of the present invention shown in FIG. 5. In FIG. 6, illustration is made on operation waveforms of the signal to be inputted from the trigger terminal (the input-control signal 90), the signal to be inputted from the reset terminal (the CLR signal 91), the signal to be outputted from the Q terminal of the D-type flip-flop circuit 10 of the edge detecting circuit 7 (the OC signal 18), the signal to be outputted from the NAND circuit 12 of the switching circuit 36 (the output signal 14), the signal to be outputted from the NAND circuit 37 of the switching circuit 36 (the output signal 38), the signal to be outputted from the inverter 9 of the edge detecting circuit 7 (the output signal 16), and the signal to be outputted from the driver connection terminal (an OUT signal 94).

The circuit for generating a ternary signal of this third preferred embodiment of the present invention receives the high or low binary input-control signal 90 and the high or low binary CLR signal 91 as shown in FIG. 6. In this third preferred embodiment, VCC level is in use as high level of the input-control signal 90 and the CLR signal 91, and ground level is in use as low level of the input-control signal 90.

The input-control signal 90 and the CLR signal 91 are inputted to the sequential circuit 35. The sequential circuit 35 processes the input-control signal 90 in compliance with the CLR signal 91 at the edge detecting circuit 7 and the switching circuit 36, and outputs the output signals 14, 38 and 16.

The inverter 9 of the edge detecting circuit 7 inverts the inputted input-control signal 90, and outputs the inverted signal as the output signal 16. In FIG. 6, since the input-control signal 90 is in low level during a time period from timing T2 to timing T3, a time period from timing T4 to timing T5, and a time period from timing T7 to timing T8, the output signal 16 is in high level during the same time periods.

The initial state of the OC signal 18, which is outputted from the Q terminal of the D-type flip-flop circuit 10 of the edge detecting circuit 7, is in low level. When the CLR signal 91, which is inputted from the reset terminal, is in high level, the D-type flip-flop circuit 10 is set to an initial state, and at the same time, the OC signal 18 is switched to low level (during a time period from timing T0 to timing T1). When the CLR signal 91 is switched from high level to low level and then the D-type flip-flop circuit 10 is released from the initial state (at timing T1 of FIG. 6). After that, when rising edge of the output signal 16 from the inverter 9 is detected, the D-type flip-flop circuit 10 is triggered, and at the same time, the OC signal 18 is set to high level (at timing T2 of FIG. 6). The OC signal 18 is kept in high level until next CLR signal 91 of high level is detected (during a time period from timing T2 to timing T6 in FIG. 6).

The NAND circuit 37 of the switching circuit 36 of the sequential circuit 35 receives the input-control signal 90 and the OC signal 18, and outputs the output signal 38. The output signal 38 is set to high level when at least one of the input-control signal 90 and the OC signal 18 is in low level (during a time period before timing T3, a time period from timing T4 to timing T5, and a time period after timing T6). The output signal 38 is set to low level when both the input-control signal 90 and the OC signal 18 are in high level (during a time period from timing T3 to timing T4 and a time period from timing T5 to timing T6).

The NAND circuit 12 receives the inverted signal of the OC signal 18 and the input-control signal 90, and outputs the output signal 14. The output signal 14 is set to high level when at least one of the inverted signal of the OC signal 18 and the input-control signal 90 is in low level (during a time period from timing T2 to timing T6 and a time period from timing T7 and timing T8). The output signal 14 is set to low level when both the inverted signal of the OC signal 18 and the input-control signal 90 are in high level (during a time period before timing T2, a time period from timing T6 and timing T7, and a time period after timing T8).

The output signal 14 from the sequential circuit 35 is inputted to the level-shifting circuit 41 and performed level conversion thereon, and then outputted as the output signal 48. The output signal 14 and the output signal 48 differ from each other in voltage level, but their waveforms are almost same to each other.

The output signal 38 from the sequential circuit 35 is inputted to the level-shifting circuit 40 and performed level conversion thereof, and then outputted as the output signal 47. The output signal 38 and the output signal 47 differ from each other in voltage level, but their waveforms are almost same to each other.

The output signals 48 from the level-shifting circuit 41, the output signals 47 from the level-shifting circuit 40, and the output signal 16 from the level-shifting circuit 35 are inputted to the ternary output generating circuit 42, respectively. The output signal 48 controls the HTR43 of the ternary output generating circuit 42, the output signal 47 controls the HTR44 of the ternary output generating circuit 42, and the output signal 16 controls the LTR45 of the ternary output generating circuit 42.

According to the above-mentioned operation, the respective output signals 48, 47 and 16, which are outputted from the level-shifting circuits 41 and 40 and the sequential circuit 35, and the input-control signal 90 and the OC signal 18 have relations as follows.

When a combination of the input-control signal 90 and the OC signal 18 is [H, H], the output signals 48, 47 and 16 are H, L and L, respectively.

When the combination of the input-control signal 90 and the OC signal 18 is [H, L], the output signals 48, 47 and 16 are L, H and L, respectively.

When the combination of the input-control signal 90 and the OC signal 18 is [L, H] or [L, L], the output signals 48, 47 and 16 are H, H and H, respectively.

In addition, the output signals 48, 47 and 16, and the OUT signal 94, which is outputted from the driver connection terminal, have relations as follows.

When a combination of the output signals 48, 47 and 16 is [L, H, L], the HTR43 is turned on, and the HTR44 and the LTR45 are turned off. In this case, since a signal of VDDH2 level at the source terminal of the HTR43 is applied to the driver connection terminal, the OUT signal 94 of VDDH2 level is outputted from the driver connection terminal.

At this timing, since the diode 46 is provided between the VDDH3 terminal and the connection point of the source terminal and the back-gate terminal of the HTR44, no current from the VDDH2 level to the VDDH3 level flows through a forward direction diode, which generally exists between the drain terminal and back-gate terminal of the HTR44, even if the HTR43 is turned on.

When the combination of the output signals 48, 47 and 16 is [H, L, L], the HTR44 is turned on, and the HTR43 and the LTR45 are turned off. In this case, since a signal of VDDH3 level at the source terminal of the HTR44 is applied to the driver connection terminal, the OUT signal 94 of VDDH3 level is outputted from the driver connection terminal.

When the combination of the output signals 48, 47 and 16 is [H, H, H], the LTR45 is turned on, and the HTR43 and the HTR44 are turned off. In this case, since a signal of ground level at the source terminal of the LTR45 is applied to the driver connection terminal, the OUT signal 94 of ground level is outputted from the driver connection terminal.

Therefore, the HTR43 and the LTR45 are switched in a complementary manner in compliance with the input-control signal 90 when the OC signal 18 is in low level. The HTR44 and the LTR45 are switched in a complementary manner in compliance with the input-control signal 90 when the OC signal 18 is in high level. This leads that a ternary signal is outputted from the driver connection terminal.

As described above, the circuit for generating a ternary signal in accordance with this third preferred embodiment of the present invention can output a ternary signal of VDDH2 level, VDDH3 level, and ground level in the case that a high or low binary input-control signal and a high or low binary reset signal are inputted thereto. According to the circuit for generating a ternary signal in accordance with this third preferred embodiment of the present invention, by providing a diode for preventing a reverse current, a circuit for generating a ternary signal having high-reliability can be realized even if a positive power supply is in use as a power supply.

In addition, in this third preferred embodiment, the level-shifting circuit 41 is provided between the output terminal of the NAND circuit 12 and the gate terminal of the HTR43, and the level-shifting circuit 40 is provided between the output terminal of the NAND circuit 37 and the gate terminal of the HTR44. However, the configuration of the embodiment is not limited to this configuration. By setting the potential at the VDDH2 terminal and the potential at the VDDH3 terminal td a value approximating VCC level, which is a power supply voltage of the sequential circuit 35, the similar effect as in this third preferred embodiment of the present invention, such that a ternary signal of VDDH2 level, VDDH3 level, and ground level is outputted, can be obtained without providing the level-shifting circuit 40 and/or the level-shifting circuit 41.

As will be understood by the description of the above-mentioned three embodiments, the circuit for generating a ternary signal of the present invention can be utilized, for example, in a multi-channel driver that is in use for a PDP panel wherein a binary input-control signal and a binary reset signal are in use, or the like.

The disclosure of Japanese Patent Application No. 2004-352040 filed Dec. 3, 2004 including specification, drawings and claims is incorporated herein by reference in its entirety.

Although the present invention has been described with respect to its preferred embodiments in some detail, the disclosed contents of the preferred embodiments may change in the details of the structure thereof, and any changes in the combination and sequence of the component may be attained without departing from the scope and spirit of the claimed invention.

What is claimed is:

1. A circuit for generating a ternary signal that receives a binary input-control signal and a binary reset signal and outputs a ternary signal from an output terminal, the circuit for generating a ternary signal comprising:

a first transistor being on-off controlled by a first control signal, wherein a source is connected to a high-potential-side power supply and a drain is connected to the output terminal;

a second transistor being on-off controlled by a second control signal, wherein a source is connected to a first low-potential-side power supply and a drain is connected to the output terminal;

a third transistor being on-off controlled by a third control signal, wherein a source is connected to a second low-potential-side power supply that is lower than the first low-potential-side power supply and a drain is connected to the output terminal; and a sequential circuit receiving the input-control signal and the reset signal, being set to an initial state when the reset signal is a first signal level, outputting the first control signal and the third control signal that make the first transistor and the third transistor be switched in a complementary manner in compliance with a level of the input-control signal in the initial state, being released from the initial state when the reset signal is switched from the first signal level to a second signal level, and outputting the second control signal and the third control signal that make the second transistor and the third transistor be switched in a complementary manner in compliance with a level of the input-control signal after a falling edge of the input-control signal is detected in a state that the sequential circuit is released from the initial state.

2. The circuit for generating a ternary signal of claim 1, wherein the sequential circuit includes an edge detecting circuit having an inverter for inverting the input-control signal and outputting the inverted signal as the third control signal, and a D-type flip-flop circuit for outputting an output control signal being high when a rising edge of the third control signal is detected in a state that the reset signal is low and being low when the reset signal is high; and a switching circuit outputting the first control signal and the second control signal in compliance with the output control signal and the input-control signal.

3. The circuit for generating a ternary signal of claim 2, wherein the switching circuit includes:

an NAND circuit for inverting a logical sum of a inverted signal of the output control signal and the input-control signal and outputting the inverted signal as the first control signal, and an AND circuit for outputting a logical sum of the output control signal and the input control signal as the second control signal, and wherein the first transistor is a P-channel MOS transistor,
the second transistor is a first N-channel MOS transistor,
the third transistor is a second N-channel MOS transistor,
the high-potential-side power supply is a positive potential,
the first low-potential-side power supply is a zero potential, and
the second low-potential-side power supply is a negative potential.

4. The circuit for generating a ternary signal of claim 3, further comprising:

a first level-shifting circuit that is provided between an output terminal of the inverter and a gate of the third transistor, and shifts a voltage level of a signal inputted thereto in compliance with the signal.

5. The circuit for generating a ternary signal of claim 3, further comprising:

a first level-shifting circuit that is provided between an output terminal of the inverter and a gate of the third transistor, and shifts a voltage level of a signal inputted thereto in compliance with the signal, and a second level-shifting circuit that is provided between an output terminal of the NAND circuit and a gate of the first transistor, and shifts a voltage level of a signal inputted thereto in compliance with the signal.

6. The circuit for generating a ternary signal of claim 2, wherein the switching circuit includes:

a first NAND circuit for inverting a logical sum of a inverted signal of the output control signal and the input-control signal and outputting the inverted signal as the first control signal, and a second NAND circuit for inverting a logical sum of the output control signal and the input-control signal and outputting the inverted signal as the second control signal, and wherein the first transistor is a first P-channel MOS transistor,
the second transistor is a second P-channel MOS transistor,
the third transistor is a N-channel MOS transistor,
the high-potential-side power supply is a first positive potential,
the first low-potential-side power supply is a second positive potential, and
the second low-potential-side power supply is a zero potential.

7. The circuit for generating a ternary signal of claim 6, further comprising:

a rectifier provided between the first low-potential-side power supply and a source of the second transistor.

8. The circuit for generating a ternary signal of claim 6, further comprising:

a first level-shifting circuit that is provided between an output terminal of the first NAND circuit and a gate of the first transistor, and shifts a voltage level of a signal inputted thereto in compliance with the signal, and a second level-shifting circuit that is provided between an output terminal of the second NAND circuit and a gate of the second transistor, and shifts a voltage level of a signal inputted thereto in compliance with the signal.

9. The circuit for generating a ternary signal of claim 7, further comprising:

a first level-shifting circuit that is provided between an output terminal of the first NAND circuit and a gate of the first transistor, and shifts a voltage level of a signal inputted thereto in compliance with the signal, and a second level-shifting circuit that is provided between an output terminal of the second NAND circuit and a gate of the second transistor, and shifts a voltage level of a signal inputted thereto in compliance with the signal.

* * * * *